US009019745B1

(12) United States Patent
Cheng et al.

(10) Patent No.: US 9,019,745 B1
(45) Date of Patent: Apr. 28, 2015

(54) VERIFY PULSE DELAY TO IMPROVE RESISTANCE WINDOW

(71) Applicant: Adesto Technologies Corporation, Sunnyvale, CA (US)

(72) Inventors: Chuanding Cheng, San Jose, CA (US); Shane Hollmer, Grass Valley, CA (US)

(73) Assignee: Adesto Technology Corporation, Sunnyvale, CA (US)

( * ) Notice: Subject to any disclaimer, the term of this patent is extended or adjusted under 35 U.S.C. 154(b) by 154 days.

(21) Appl. No.: 13/743,939

(22) Filed: Jan. 17, 2013

(51) Int. Cl.
*G11C 11/00* (2006.01)
*G11C 13/00* (2006.01)

(52) U.S. Cl.
CPC .................... *G11C 13/0064* (2013.01)

(58) Field of Classification Search
USPC .................................................. 365/148, 163
See application file for complete search history.

(56) References Cited

U.S. PATENT DOCUMENTS

2011/0051497 A1* 3/2011 Kim et al. ...................... 365/148

* cited by examiner

*Primary Examiner* — Huan Hoang
(74) *Attorney, Agent, or Firm* — Michael C. Stephens, Jr.

(57) ABSTRACT

Structures and methods for controlling operation of a programmable impedance element are disclosed herein. In one embodiment, a method of programming/erasing the programmable impedance element can include: (i) receiving a program/erase command to be executed on the programmable impedance element; (ii) generating, in response to the program/erase command, a program/erase pulse for performing a program/erase operation on the programmable impedance element; (iii) generating a time delay from the program/erase pulse, where the time delay includes additional delay to allow for at least partial dissipation of one or more effects caused by the program/erase operation; and (iv) performing, after the time delay has elapsed, a verify operation to determine if the program/erase operation has successfully programmed/erased the programmable impedance element.

20 Claims, 12 Drawing Sheets

VERIFY PULSE DELAY TO IMPROVE RESISTANCE WINDOW

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive RAM (ReRAM) and conductive bridging RAM (CBRAM), may offer relatively lower power and higher speeds as compared to flash memory technologies. CBRAM utilizes a conductive bridging cell technology, which has the potential to scale to smaller sizes than flash memory devices.

SUMMARY

Embodiments of the present invention relate to controlling program and erase operation of a programmable impedance element.

In one embodiment, a method of programming the programmable impedance element can include: (i) receiving a program command to be executed on the programmable impedance element; (ii) generating, in response to the program command, a program pulse for performing a program operation on the programmable impedance element; (iii) generating a time delay from the program pulse, where the time delay includes additional delay to allow for at least partial dissipation of one or more effects caused by the program operation; and (iv) performing, after the time delay has elapsed, a verify operation to determine if the program operation has successfully programmed the programmable impedance element.

In one embodiment, a method of erasing the programmable impedance element can include: (i) receiving an erase command to be executed on the programmable impedance element; (ii) generating, in response to the erase command, an erase pulse for performing an erase operation on the programmable impedance element; (iii) generating a time delay from the erase pulse, where the time delay includes additional delay to allow for at least partial dissipation of one or more effects caused by the erase operation; and (iv) performing, after the time delay has elapsed, a verify operation to determine if the erase operation has successfully erased the programmable impedance element.

In one embodiment, an apparatus can include: (i) a command decoder configured to receive a program/erase command to be executed on a programmable impedance element; (ii) a program/erase operation controller configured to generate, in response to the program/erase command, a write pulse for performing a program/erase operation on the programmable impedance element; (iii) a delay controller configured to generate a time delay from the write pulse, where the time delay includes additional delay to allow for at least partial dissipation of one or more effects on the programmable impedance element caused by the program/erase operation; and (iv) a verify operation controller configured to perform a verify operation to determine if the program/erase operation has successfully written the programmable impedance element, where the verify operation begins after the time delay has elapsed.

Embodiments of the present invention can advantageously provide for improved program and erase algorithms relative to conventional approaches. Particular embodiments are suitable for resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention.

However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating PMCs that can be programmed/written and erased between one or more resistance and/or capacitive states.

Figure 1:
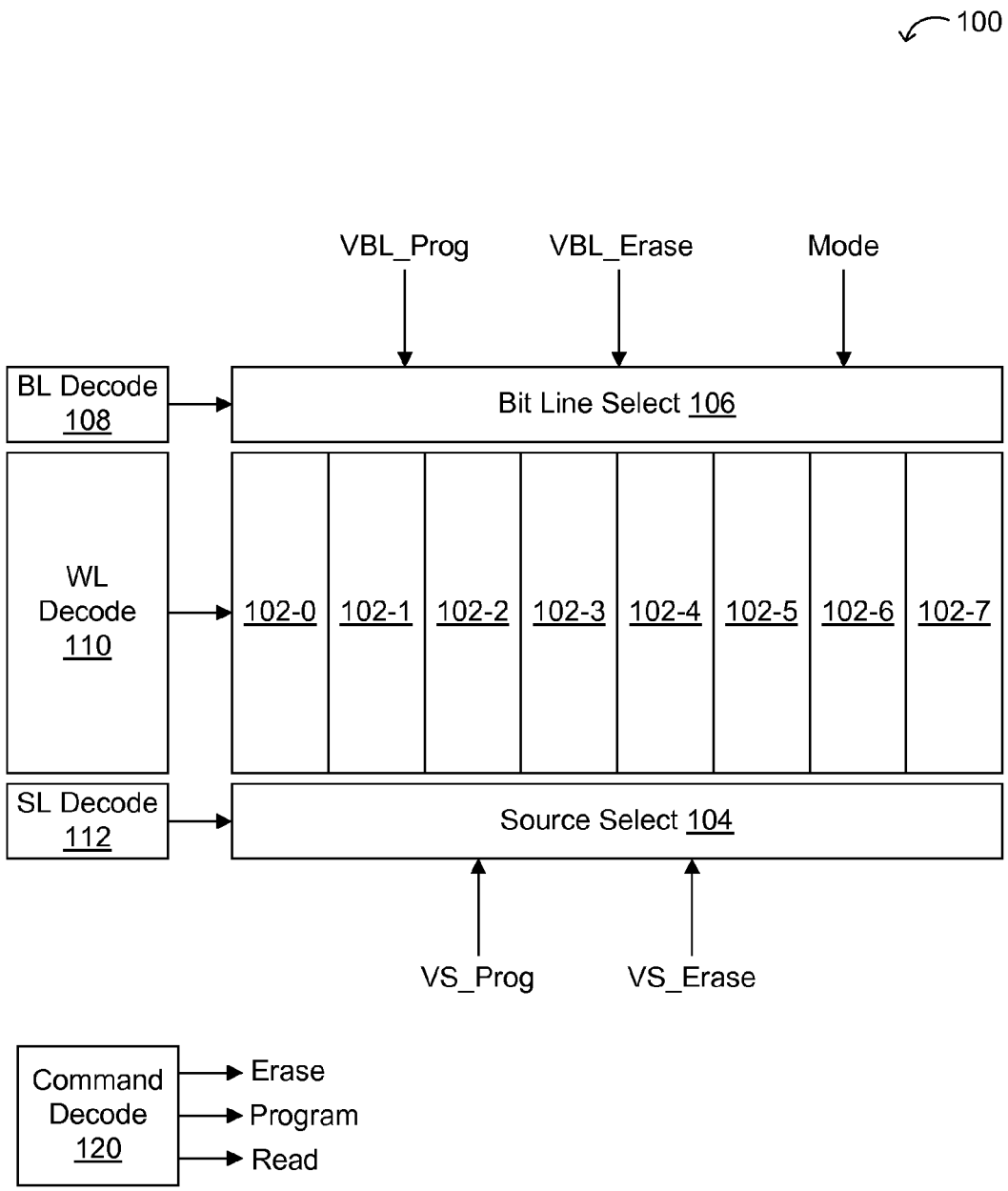
FIG. 1 is an example memory device arrangement.
Figure 2:
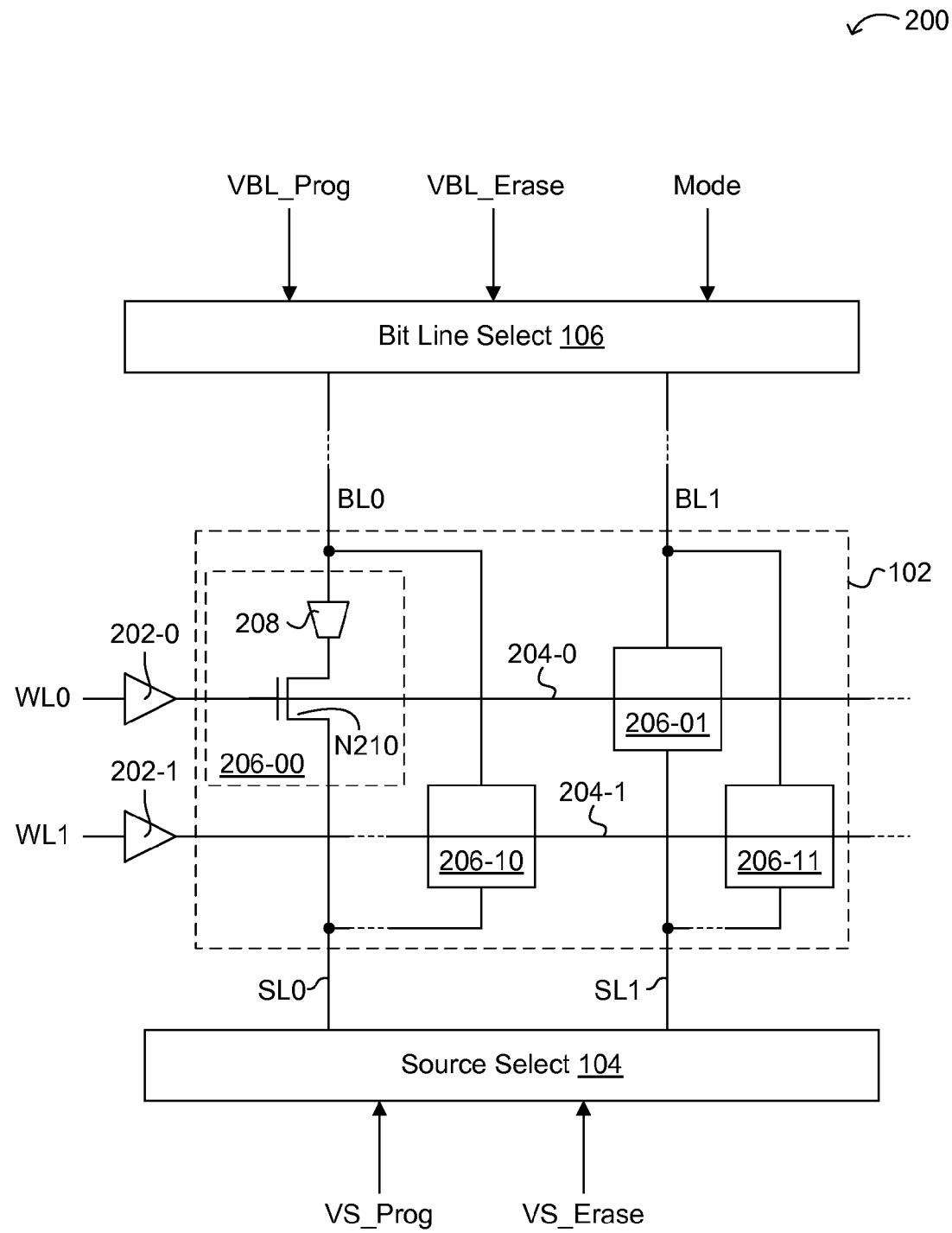
FIG. 2 is a diagram of an example memory device and memory cell structure.

FIGS. 1 and 2 show example memory architectures and circuit structures that can utilize PMCs, or other such devices, of particular embodiments. However, PMCs of particular embodiments are suitable for use in a wide variety of memory architectures and circuit structures.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, verify, etc.) in response. Such internal operation control signals can be used to generate various supply levels (e.g., particular program and erase voltage levels), as well as other control signals (e.g., program or erase operation control signals), as will be discussed in more detail below. In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

In one example, PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be generated from power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage generator (e.g., based on a reference voltage) of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1-V2) in an anode-to-cathode direction. In an erase operation, a PMC to be erased can be connected between suitable voltages (e.g., V2-V1) in a cathode-to-anode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be equal to an erase voltage, which may both be within the range of a supply voltage (Vprog=V1-V2, Verase=V2-V1, Supply voltage=maximum of V1 and V2). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell 206, thus placing its corresponding access device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation (which may be part of a sequence of operations in a program "algorithm"), in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation (which may be part of a sequence of operations in an erase "algorithm") can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltages and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2 have been described, programmable impedance elements in certain embodiments are suitable to a wide variety of architectures, structures, and/or circuit arrangements.

Figure 3:
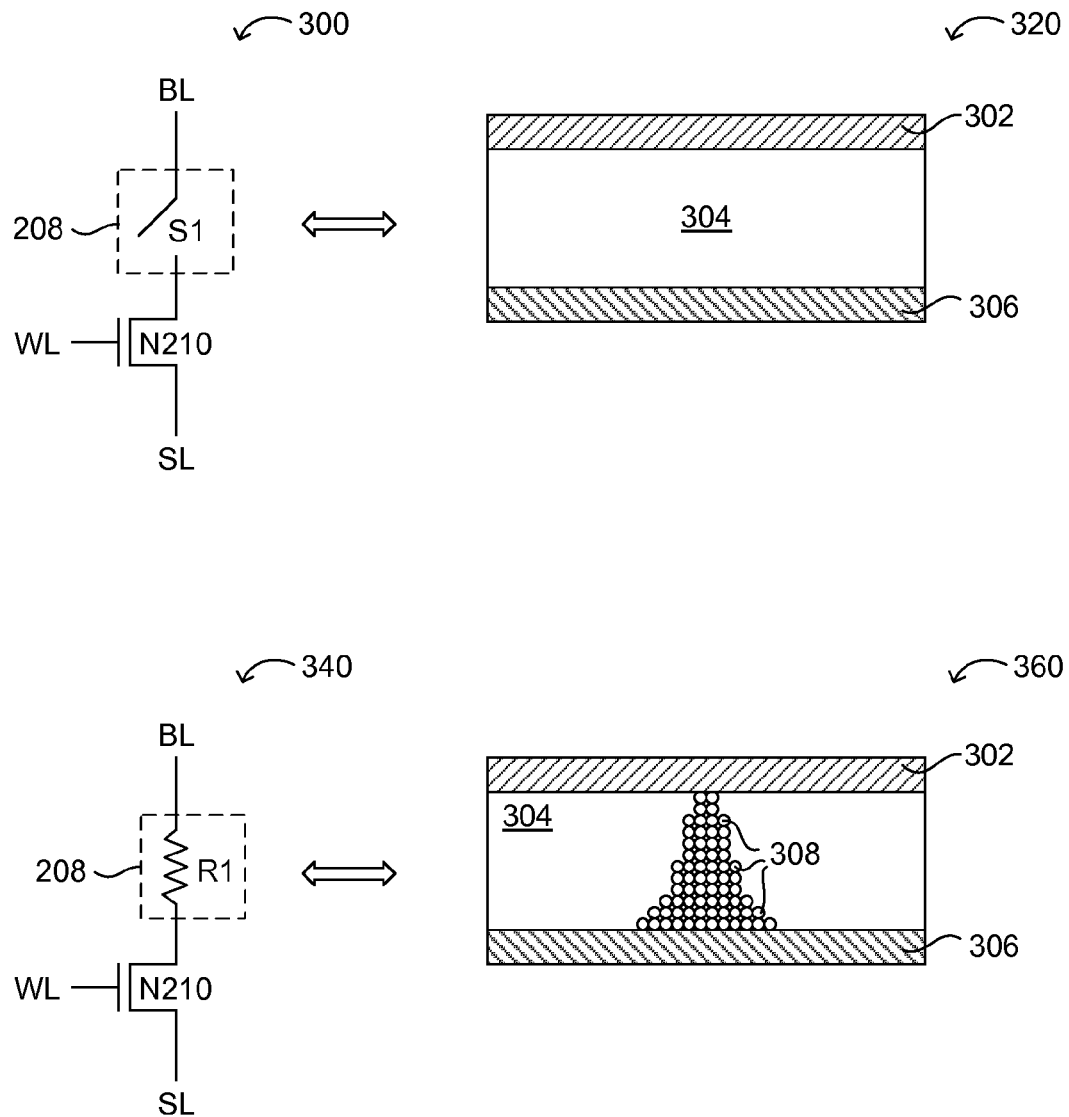
FIG. 3 is a diagram of an example programmable impedance element with schematic modeling.

Referring now to FIG. 3, shown is a diagram of an example programmable impedance element with corresponding schematic modeling. Example 300 shows a memory cell with an open switch 51 representation of PMC 208. The PMC portion of this representation corresponds to the cross-section diagram 320, which represents a PMC or programmable impedance element in a high impedance state (e.g., state "0"), or an erased state. Partially dissolved or erased states may also be detected as a data state "0," or a multi-bit value, in some applications, and depending on the read-trip point. As used herein, "PMC" may be one example of a "programmable impedance element." In this example, PMC 320 can include electrochemically active electrode 302, solid electrolyte 304, and inert electrode 306.

Schematic representation 340 and corresponding cross-section diagram 360 show examples of PMC 208 in a low impedance state (e.g., state "1"), or a programmed state. Partial conductive paths may also be detected as a data state "1," or a multi-bit value, in some applications, and depending on the read-trip point. Example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in examples 300 and 340, a control transistor (e.g., N210) can also be included in each memory cell including the programmable impedance element or PMC 208. For example, transistor N210 can be controlled by a word line 204, as discussed above with respect to FIG. 2.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes. Also, other types or arrangements of electrodeposits 308 can be found in other programmable impedance element structures that are also suitable for use in particular embodiments.

Solid electrolyte 304 can include a chalcogenide compound, such as a germanium selenium (Ge—Se) compound. Solid electrolyte 304 can be formed by photodissolution of metal into a chalcogenide base glass. Chalcogenide materials are chemical compounds consisting of at least one chalcogen ion (a chemical element in column VI of the periodic table, also known as the oxygen family). More precisely, the term chalcogenide refers to the sulphides, selenides, and tellurides. PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias. Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

Various materials can be utilized to form electrodes 302 and 306. For example, inert electrode 306 can include tungsten, and electrochemically active electrode 302 can include silver, copper, or a metal compound. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 µA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "1" data value stored in that cell. However, if there is no nanowire or conductive path between electrodes in the cell (e.g., 320), the resistance is higher, leading to low current, and that can be read as a "0" data value stored in that cell.

Cell data can be erased in similar fashion to cell writing or programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC can be substantially symmetric to a program or write operation.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage and may produce a trail of conducting defects (a "filament"). Thus, for CBRAM, one electrode provides the dissolving ions, while for ReRAM, a one-time "forming" step may be required to generate the local damage.

CBRAM/ReRAM devices can be functional by being placed into a low resistance state with a programming operation, and a high resistance state with an erase operation. The resistance window defined by the low $R_{on}$ state and high $R_{off}$ state may determine product yield, in term of program, erase, endurance, and retention, etc. However, some CBRAM/ReRAM program operation failures can be attributed to a "reverse" erase effect whereby cell resistance is actually increased as a result of a program operation, and thus resistance change is in a same direction as an expected erase operation. Similarly, some CBRAM/ReRAM erase operation failures can be attributed to a reverse program effect whereby cell resistance is actually decreased as a result of an erase operation, and thus resistance change is in a same direction as an expected program operation. Also, more voltage, current, or time for subsequent attempts at programming or erasing a given storage cell may not necessarily provide suitable results, and in some cases may exacerbate the situation. Further, different cell structures can exhibit reverse program/erase effects, likely at different operating voltages or conditions.

Current going through a CBRAM/ReRAM memory device at a low resistance state can result in such a unipolar phenomenon. The erase direction current can bring resistance to a high $R_{off}$ state, and program direction current can degrade $R_{on}$ to a relatively high resistance level, depending on operating conditions. The reverse program/erase or "unipolar" phenomenon may be a thermal effect due to program/erase current, or may be a relaxation related effect due to an atomic level structure change during program/erase. Further, because delay time between program/erase pulses can accumulate or dissipate the effect, such delay can play an important role in determining the resistance window. This in particular embodiments, a programmable delay time between program/erase pulses can allow for further optimization of operating conditions to improve $R_{on}$ and $R_{off}$ distribution, and thus improving product yield.

In one embodiment, a method of programming the programmable impedance element can include: (i) receiving a program command to be executed on the programmable impedance element; (ii) generating, in response to the program command, a program pulse for performing a program operation on the programmable impedance element; (iii) generating a time delay from the program pulse, where the time delay includes additional delay to allow for at least partial dissipation of one or more effects caused by the program operation; and (iv) performing, after the time delay has elapsed, a verify operation to determine if the program operation has successfully programmed the programmable impedance element.

In one embodiment, a method of erasing the programmable impedance element can include: (i) receiving an erase command to be executed on the programmable impedance element; (ii) generating, in response to the erase command, an erase pulse for performing an erase operation on the programmable impedance element; (iii) generating a time delay from the erase pulse, where the time delay includes additional delay to allow for at least partial dissipation of one or more effects caused by the erase operation; and (iv) performing, after the time delay has elapsed, a verify operation to determine if the erase operation has successfully erased the programmable impedance element.

In one embodiment, an apparatus can include: (i) a command decoder configured to receive a program/erase command to be executed on a programmable impedance element; (ii) a program/erase operation controller configured to generate, in response to the program/erase command, a write pulse for performing a program/erase operation on the programmable impedance element; (iii) a delay controller configured to generate a time delay from the write pulse, where the time delay includes additional delay to allow for at least partial dissipation of one or more effects on the programmable impedance element caused by the program/erase operation; and (iv) a verify operation controller configured to perform a verify operation to determine if the program/erase operation has successfully written the programmable impedance element, where the verify operation begins after the time delay has elapsed.

In particular embodiments, a delay may be added between the program/erase pulse and the verify pulse. Alternatively, the delay may be between the program/erase pulse and another write pulse, another read pulse, or any other suitable next operation, and not necessarily involving a verify pulse. Thus, the delay may be realized between program/erase pulses and other pulses/operations, and in some cases without corresponding verify operations. For example, the delay (e.g., an inherent delay) can occur between two different program pulses, such as program pulses for different words in a page. In any event, delay can be included after a given program or erase operation in order to allow for various effects of the program/erase operation to at least partially dissipate. For example, the delay may be programmable (e.g., user programmable), and can be implemented as a digital, analog, or mixed signal block. Delay may also be programmed during a test mode, and/or updated during a product lifetime. In another example, the delay may be realized by performing an initial program/erase of all bits in a page, and then subsequently performing corresponding verify operations, thus providing sufficient time for the delay.

Particular embodiments can include a selectable operation algorithm for executing a program or erase command by performing one or more of a plurality of program and erase operations. Thus, a command supplied to a memory device and decoded (e.g., via 120) as a program may be carried out on a semiconductor memory device according to the selected program operation algorithm. Further, the selected program operation algorithm can include one or more program operations, each with conditions determinable by option variables, which may be accessible from a register. Similarly, a command decoded as an erase command may be carried out on a semiconductor memory device according to the selected erase operation algorithm. Further, the selected erase operation algorithm can include one or more erase operations, each with conditions determinable by option variables, which may be accessible from a register. In addition, a retry operation can be included in some of the program and erase operations, as defined by the particular algorithm. In a retry operation, a previous program or erase operation is repeated if not fully successful up until a maximum retry count value is reached.

Figure 4:
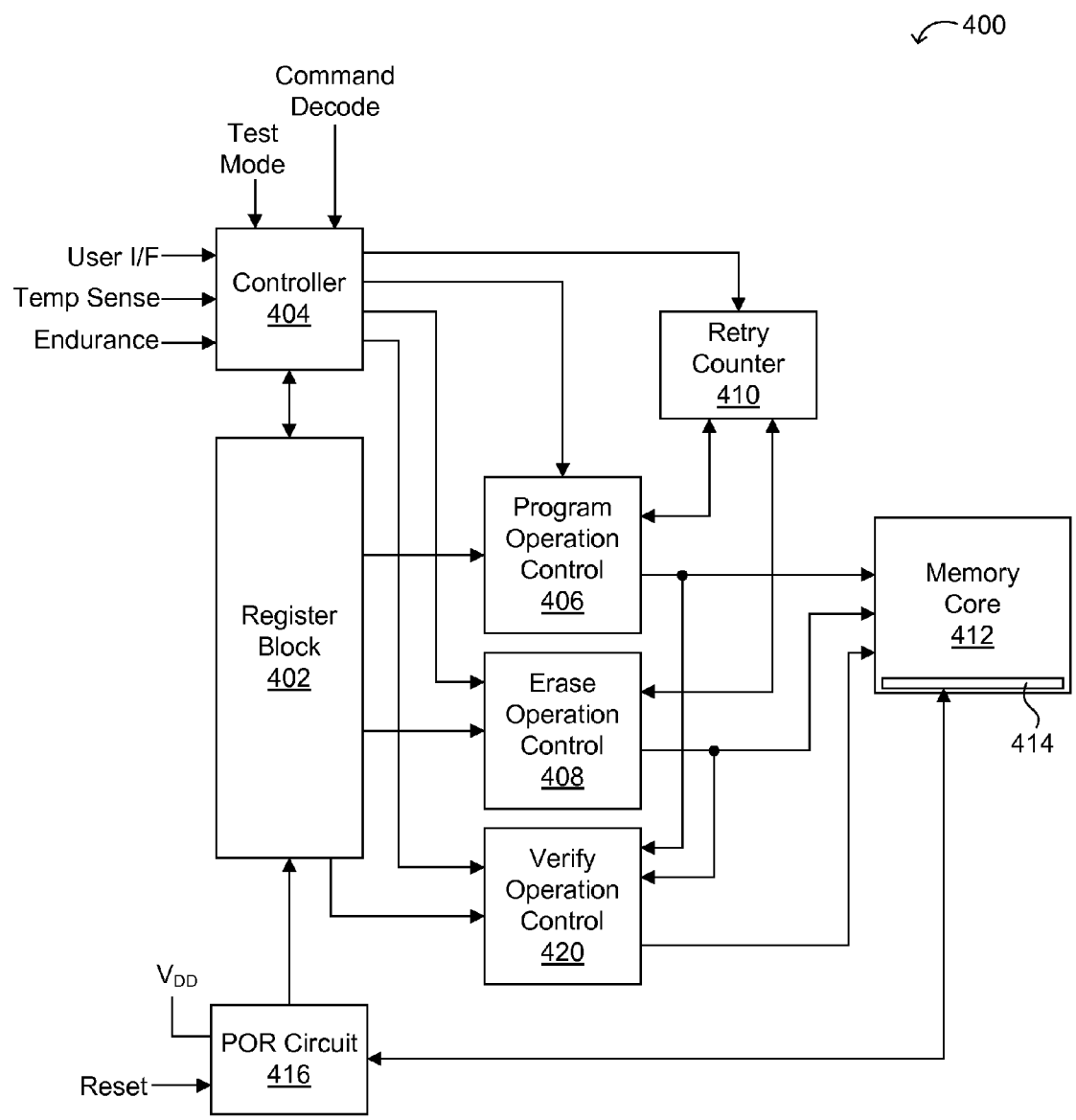
FIG. 4 is a schematic block diagram of an example register, control, and memory array structure, in accordance with embodiments of the present invention.

Referring now to FIG. 4, shown is a schematic block diagram 400 of an example register, control, and memory array structure, in accordance with embodiments of the present invention. For example, register block 402 can be implemented using static random access memory (SRAM). Register block 402 can provide algorithm and option variable selections to program operation control 406, erase operation control 408, and verify operation control 420. Controller 404 may determine and decode the received command, and can also control access to the register bits in register block 402. In addition, test modes (e.g., to determine distribution, etc.) can be used to override data in register block 402.

Controller 404 may also receive temperature (e.g., via a temperature sensor, or current circuitry that indicates temperature) and endurance (e.g., a number of cycles the device has undergone) related information, such as may be used for adjusting the delay between a program/erase pulse and a verify pulse. Settings for register block 402 may be based on various default algorithm and option variable or condition settings, but can also be programmed on lot-by-lot or device-by-device basis. Also, values for program operations, erase operations, verify operations, and option variable or related condition settings, can be independently programmed in register block 402.

Power on reset (POR) circuitry or state machine 416, which can receive a reset signal, can access designated register data portion 414 and read out data from that dedicated section of memory array 412. Designated register data portion 414 may alternatively be located outside of memory core 412. In any event, this accessed data that is associated with memory core 412 may then be loaded into register block 402. In this way, information specific to this device can be programmed into the memory core, and whenever the device is powered on (e.g., as detected by $V_{DD}$ supply) or otherwise reset, this data can be loaded into register 402. This is because the memory core, including designated register data portion 414 may include non-volatile memory. Also, different applications-based information can be stored in non-volatile memory designated register data portion 414. Further, different parts or memory cores 412 can be independently programmed (e.g., for different applications, etc.). In some cases, this dedicated portion of memory may not be accessible to the user. However, some applications may allow access to these designated locations, such as in a test mode.

Also, the non-volatile memory cells in designated register data portion 414 may be substantially identical to those in a remaining portion of memory core 412. For example, memory core 412 can include a plurality of memory cells that each can include a programmable impedance element or PMC. However, in some cases there may be some variety between the cells (e.g., programmable impedance element-based cells) of designated register data portion 414 relative to the cells found in other portions of memory core 412. For example, the cells of designated register data portion 414 may have a substantially similar structure relative to the other cells, but in order to accommodate higher retention for the critical data stored therein, the cells of designated register data portion 414 may be varied so as to provide improved retention.

In one or more test modes, controller 404 can override one or more values stored in register 402. For example, such a test mode may allow for override of a delay between program/erase and verify pulses. When the test mode is complete, data in register block 402 can revert to the data that was previously stored in the register. For example, registers 402 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 402 may be implemented as a single bit per cell or stored data bit, and data can be reverted to its previous state by accessing designated register data portion 414 and asserting the reset signal upon completion of the test mode.

In addition, registers 402 may be programmable by controller 404 and/or by a user via a separate or combined user interface. In this way, a user may be able to program data into registers 402 in order to override or change previous values therein. Particular embodiments may also support independently controlled program/erase and verify algorithm selection for different memory cores 412. For example, controller 404 can set the register values in 402 different for different memory cores 412. For example, register block 402 may include dedicated sectors (e.g., a widened register or increased register bit length) for each memory core, or register block 402 may be replicated for each memory core 412. This may be utilized whereby one memory array 412 is dedicated to one application (e.g., code), while another memory array 412 may be dedicated to another application (e.g., data). In this way, register block 402 may accommodate independently programmable operation algorithms in support of different operations for different memory cores 412.

Various program/erase and verify operation algorithm information can be stored in register block 402. Option variables that define conditions (e.g., pulse widths, voltage levels, current levels, adjustable delay until verify, etc.) for the program and erase operations of the selected operation algorithm may also be defined in register block 402. In addition, a maximum number of retry attempts, which may be embedded within one or more of the program/erase algorithms may also be stored in register block 402. For example, retry counter 410 may keep track of a number of attempts for a given program or erase operation, or a sequence of program and/or erase operations, and associated verify operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. Such counters may also be used in order to adjust a delay between program/erase and corresponding verify pulses. In one example, designated register data portion 414 can be updated to reflect changed algorithm selections, option variables, etc., values based on such counter results. As a result, register block 402 can be updated via POR circuit 416, as discussed above. In another example, incremented values based on the counter results can be dynamically determined based on data output from register block 402. In this case, data that is read from register block 402 can then be updated by subsequent circuitry based on the counter results, before being provided as outputs to program operation control 406 and erase operation control 408.

Other fields (not shown) may be used to indicate option variables to set conditions for the various algorithms. Various fields of register block 402 may generally be used to form or support a conditions table that may be accessed (e.g., by program operation control 406, erase operation control 408, verify operation control 420, etc.) to set the conditions for one or more of the program, erase, and verify operations of a selected operation algorithm. For example, 24 registers can be included, where each register is 8-bits wide. In addition, such registers may support other programmable impedance device-based functions, such as word line voltage level, compliance current (e.g., where the cell is programmed until reaching this compliance current, X µA), equalization pulse width, single ended or differential sense amplifier configuration, as well as any number of other device functions and/or parameters.

As discussed herein "algorithms" can include one or more of testing algorithms, methods, operations and/or procedures, such as one or more of a plurality of program and erase operations to carry out a program or erase command. For example, one or more operations can include a series of program pulses with verifies in between and/or a series of erase pulses with verifies in between. Also, program/erase voltages and/or pulse widths may also be adjusted as a number of pulses or attempts increases. In addition, delay between a program/erase or "write" operation and a corresponding verify operation can be included in the write algorithm.

Figure 5:
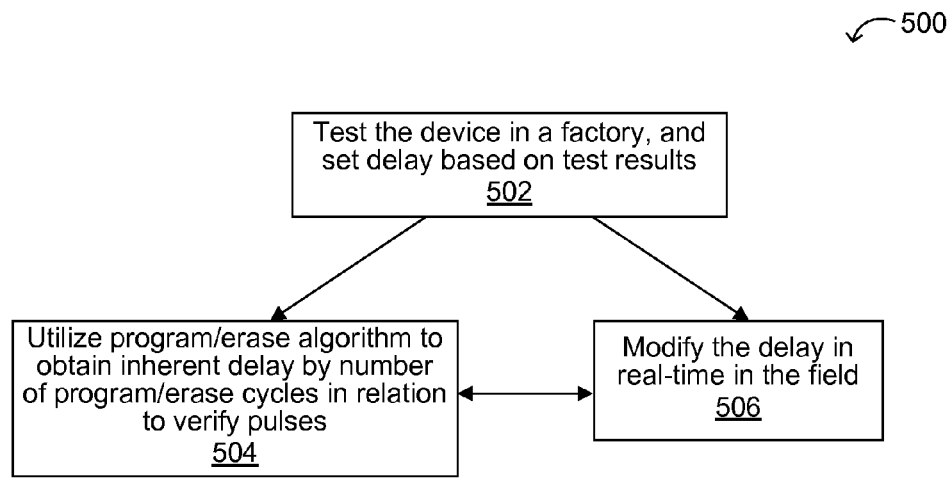
FIG. 5 is a diagram of example delay determinations in accordance with embodiments of the present invention.

Referring now to FIG. 5, shown is a diagram 500 of example delay determinations in accordance with embodiments of the present invention. In particular embodiments, delay (e.g., after program/erase operations) can be determined, modified, or set in a test or factory environment, as well as in "real-time" in the field during operation of the device. At 502, the device may be tested in a factory, and the delay may be set based on test results. For example, the delay may be set based on optimization of yield, reliability, and/or performance. Such delay may be stored in non-volatile registers (e.g., designated register data portion 414) for subsequent access.

Other possibilities for delay selection can include algorithmic approaches, as well as real-time delay modification. At 504, a program/erase algorithm can be used to obtain an inherent delay. This inherent delay can occur due to program/erase cycles in relation to verify (or other operation) pulses. For example, the program/erase algorithm may obtain the delay by a number of programming or erases pulses prior to performing the verify (or other operation). Further, this inherent delay may be in addition to, or in place of, the delay initially set at the factory at 502. Alternatively, or in addition to such algorithmic approaches, delay can be modified real-time in the field at 506. For example, such delay can be modified based on a device temperature, a number of cycles as an endurance indicator, or any other suitable considerations that may affect adverse consequences of program/erase operations.

Figure 6:
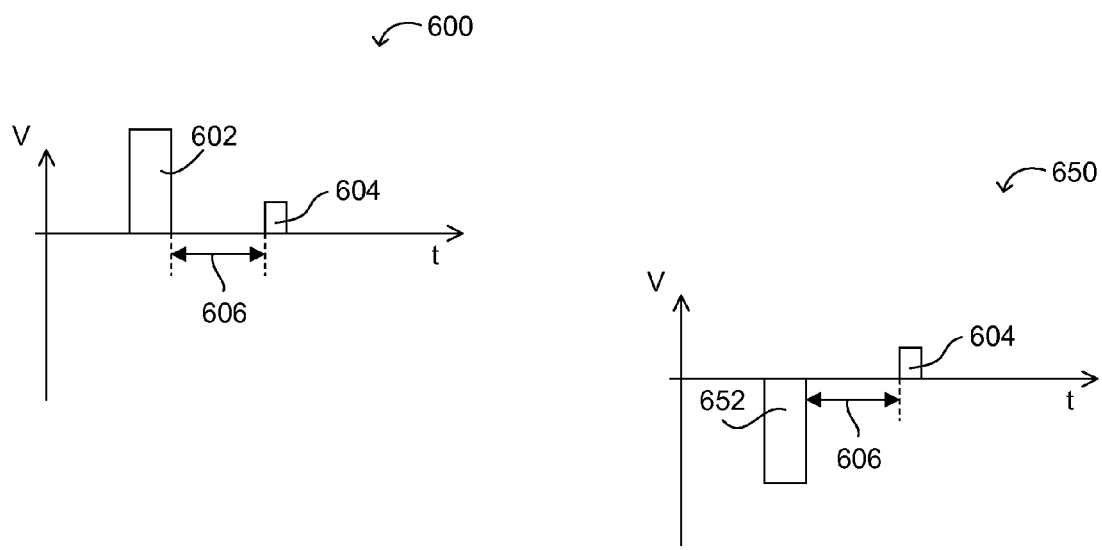
FIG. 6 is a timing diagram of an example delay between program/erase pulses and verify pulses in accordance with embodiments of the present invention.

Referring now to FIG. 6, shown is a timing diagram of an example delay between program/erase pulses and verify pulses in accordance with embodiments of the present invention. Example 600 shows program pulse 602 followed by verify pulse 604 after a time delay 606. Similarly, example 650 shows erase pulse 652 followed by verify pulse 604 after a time delay 606. In particular embodiments, additional time delay 606 can allow for at least partial dissipation (e.g., via temperature reduction, relaxation, etc.) of one or more effects (e.g., thermal, structure change, charge relaxation, diffusion, etc.) caused by the program/erase operation. For example, the time delay can be in a range from about 100 ns to about 10 ms. However, delays of less than 100 ns or greater than 10 ms may also be utilized in particular embodiments. In fact, any delay between the program/erase pulse and the verify pulse that is sufficient to allow for dissipation of temporary negative effects caused by the program/erase pulse can be utilized in particular embodiments.

Time delay 606 can be adjusted according to varied temperature level, as shown below in Table 1. For example, based on a sensed temperature of the device, different delays can be selected as, or to be included within, time delay 606. For example, the delay select bits can correspond to register bits in block 402 to select a different data value that corresponds to that programmable delay.

TABLE 1

| Delay Select | Temperature Range |
| --- | --- |
| 00 | <0° C. |
| 01 | >0° C. and <50° C. |
| 10 | >50° C. and <100° C. |
| 11 | >100° C. and <150° C. |

Time delay 606 can also be adjusted according to an endurance life cycle of the device, as shown below in Table 2. For example, delay time can be updated to adapt to the forming and number of cycles a memory device has gone through. Also, the delay select bits can correspond to register bits in block 402 to select a different data value that corresponds to that programmable delay. In addition, the delay can be changed based on a number of attempts of a program/erase operation, as opposed to completed cycles. Further, delay can be changed based on any suitable write parameters (e.g., program/erase voltages, pulse width, etc.).

TABLE 2

| Delay Select | Endurance |
| --- | --- |
| 00 | 1 cycle |
| 01 | 2 cycles to 100 cycles |
| 10 | 101 cycles to 1,000 cycles |
| 11 | 1,001 cycles to 10,000 cycles |

Figure 7:
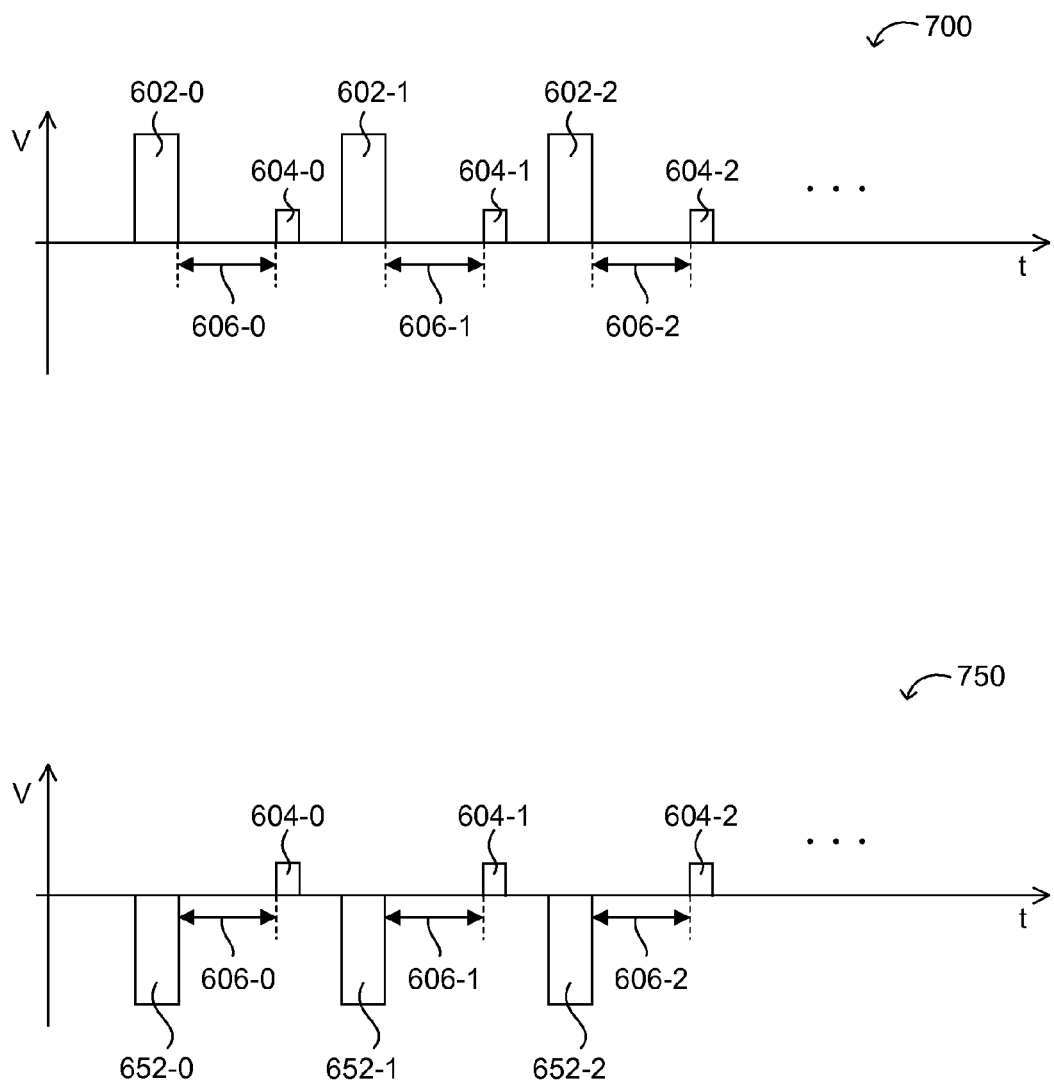
FIG. 7 is a timing diagram of example delay between multiple program/erase pulses and corresponding verify pulses in accordance with embodiments of the present invention.

Referring now to FIG. 7, shown is a timing diagram of example delay between multiple program/erase pulses and corresponding verify pulses in accordance with embodiments of the present invention. As shown in 700, program pulses 602 (e.g., 602-0, 602-1, 602-2, etc.) can be followed by corresponding verify pulses 604 (e.g., 604-0, 604-1, 604-2, etc.) that follow corresponding time delays 606 (e.g., 606-0, 606-1, 606-2, etc.). Similarly, as shown in example 750, erase pulses 652 (e.g., 652-0, 652-1, 652-2, etc.) can be followed by corresponding verify pulses 604 (e.g., 604-0, 604-1, 604-2, etc.) that follow corresponding time delays 606 (e.g., 606-0, 606-1, 606-2, etc.).

While delays 606 are shown in the example of FIG. 7, and in other examples herein, as being the same, or substantially the same, such delays may actually be different. For example, particular embodiments can include a longer delay for a first attempt, followed by a shorter delay for a second attempt, and so on. Thus in such a case, delay 606-0 may be greater than delay 606-1, which may be greater than delay 606-2, and so on. Alternatively, sequential delays may increase for subsequent attempts. Thus in such a case, delay 606-0 may be less than delay 606-1, which may be less than delay 606-2, and so on. Other delay adjustments, such as increasing or decreasing delays, can occur for various delays 606.

Memory devices typically operate with a word mode having a smart program/erase algorithm by attempt pulses 602/652, where each program/erase pulse is followed by a verify pulse 604 after a corresponding time delay 606. Thus, the example of FIG. 7 may represent a word by word mode for each word applying attempt pulses until a defined maximum. Thus, the attempt pulses 602/652 and corresponding verify pulses 604 may be for one word of data. If the particular program or erase operation is successful as determined by the corresponding verify operation 604, the write operation is completed. However, if the particular program or erase operation is unsuccessful, another pulse 602/652 may be delivered until a maximum number of attempts (e.g., via retry counter 410) is made, and as defined by the selected write algorithm. The write (program or erase) operation can exhaust all such write attempts on one word prior to moving on to a next word. In particular embodiments, additional time delay 606 can allow for at least partial dissipation (e.g., via temperature reduction, relaxation, etc.) of one or more effects (e.g., thermal, structure change, charge relaxation, diffusion, etc.) caused by the program/erase operation. Also, the verify pulse 604 may be relatively low in voltage, and as such is unlikely to exacerbate any such issues.

As discussed above, a variety of mechanisms can be employed in order to determine or subsequently adjust time delay 606. For example, an initial time delay 606 can result from product characterization, and thus may be optimized coming out of the factory after test/characterization of the product. Memory cells can be characterized, and optimized time delay 606 can be stored in designated register data portion 414 and read out data from that dedicated section of memory array 412 upon power up. Subsequent adjustments can be made for device temperature variations (e.g., via a temperature sensor, temperature compensated current source, etc.), as well as endurance life cycle counts (e.g., via one or more designated counters). Adjustments can also be made if certain failures (e.g., reverse program, reverse erase, etc.) are seen, possibly after the device has left the factory. For example, capture of such failures can result in additional delay added to time delay 606. In fact, any suitable feedback mechanism that can relate or correlate to failures that can be improved upon by adjusting time delay 606 between programs/erase pulses 602/652 and verify pulses 604, can be accommodated in particular embodiments.

Figure 8:
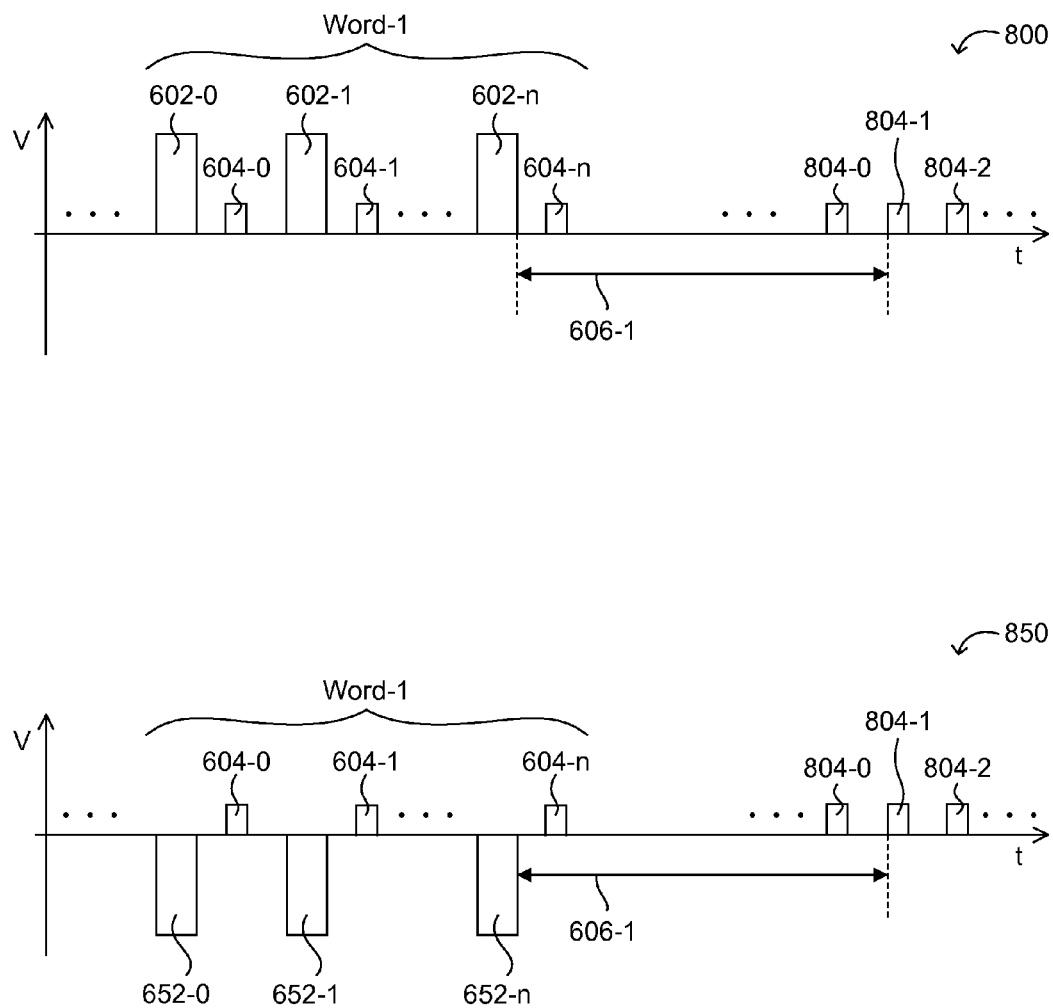
FIG. 8 is a timing diagram of example additional verify pulses after multiple program/erase and corresponding verify pulses, in accordance with embodiments of the present invention.

Referring now to FIG. 8, shown is a timing diagram of example additional verify pulses after multiple program/erase and corresponding verify pulses, in accordance with embodiments of the present invention. Example 800 shows a program operation sequence, and example 850 shows an erase operation sequence. In these examples, additional verify pulses 804 (e.g., 804-0, 804-1, 804-2, etc.) can be provided after a series of write and corresponding verify pulses as shown. For example, a page or row (e.g., 128 bytes) of cells can be programmed/erased prior to additional verify pulses 804. Thus, additional verify pulses 804 may serve to provide a subsequent determination to ensure that possible adverse effects due to program/erase operations have remained substantially dissipated.

In some cases, additional time delays (e.g., in addition to inherent or standard delays) between program/erase pulses 602/652 and adjacent verify pulses 604 may not be necessary in this particular example operating mode because total time delay (e.g., 606-1) between a last program pulse of a given word (e.g., 602-n) and a corresponding additional verify pulse for that word (e.g., 804-1) may be sufficient. Additional verify pulses 804 may represent redundant or double checking of corresponding write pulses 602/652. However, additional verify pulses 804 may also produce a different result as compared to corresponding verify pulses 604 due to the extended delay that can allow for further dissipation of temporal effects due to the corresponding program/erase pulse. Thus, in such an operating mode as exemplified in examples 800 and 850, time delays between program/erase pulses 602/652 and adjacent verify pulses 604 can be reduced or eliminated in some cases due to sufficient delay (e.g., 606-1) between a given program pulse, such as a last program pulse for a given word, and corresponding additional verify pulse 804.

In the particular example of FIG. 8, various pulses 602 may represent program pulse attempts for a given word. For example, program pulse 602-n may represent a last program attempt in a series of program pulse attempts (e.g., 602-0, 602-1, ... 602-n) for a given word (e.g., Word-1) in a page. Similarly, erase pulse 652-n may represent a last erase attempt in a series of erase pulse attempts (e.g., 652-0, 652-1, ... 652-n) for a given word (e.g., Word-1) in a page. Thus in this example, a word by word mode can be employed to finish programming/erasing a given page, and then an additional verify pulse 804 can be applied for each word. Accordingly, a delay (e.g., 606-1) may be realized between a last attempt pulse 602-n/652-n, and an additional verify pulse 804 for each word as shown.

Figure 9:
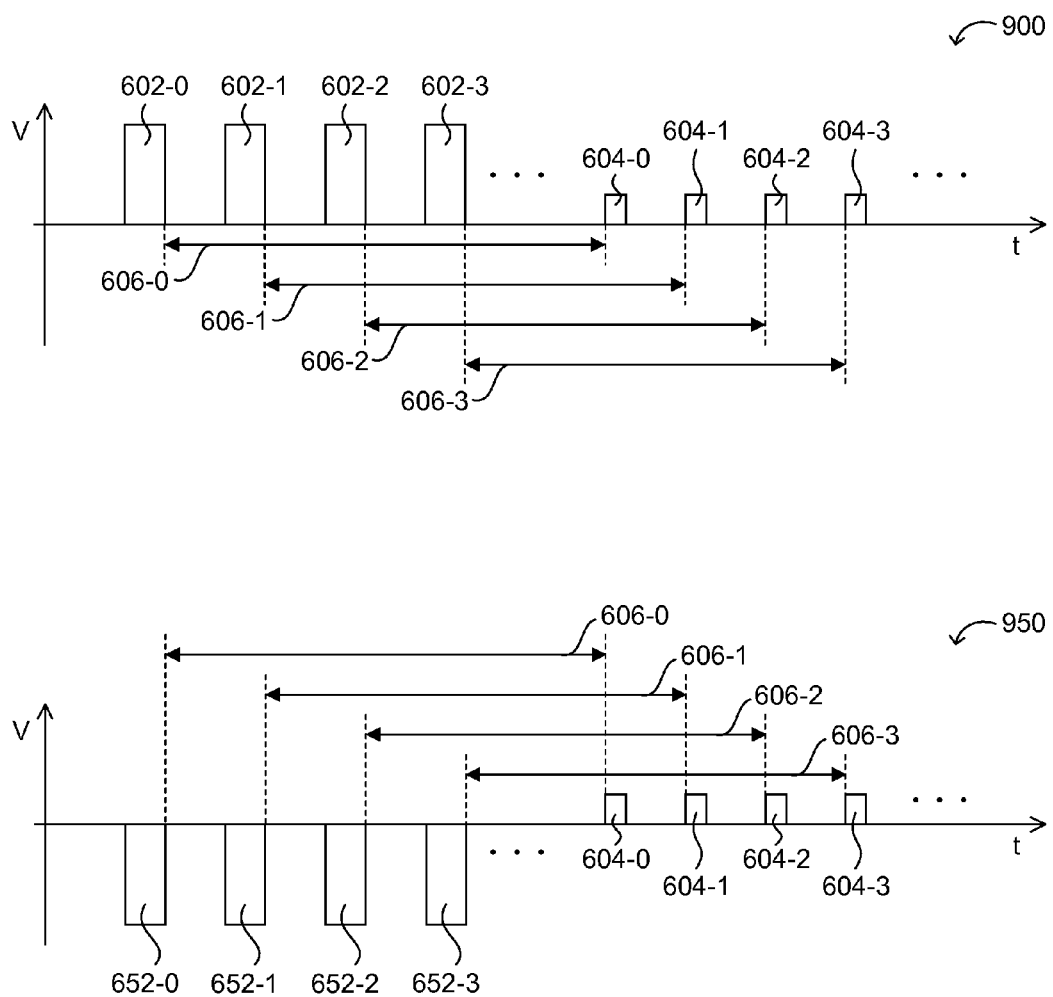
FIG. 9 is a timing diagram of example multiple verify pulses after multiple program/erase pulses in accordance with embodiments of the present invention.

Referring now to FIG. 9, shown is a timing diagram of example multiple verify pulses after multiple program/erase pulses in accordance with embodiments of the present invention. Memory devices can operate under array page mode, whereby all bits in a page (e.g., 128 bytes of data) are written to, sequentially and/or in a parallelized fashion, followed by verify operations. As shown in example 900, time delays 606 between corresponding program pulses 602 and verify pulses 604 may substantially include the time needed to cycle through programming a page of cells. Similarly, as shown in example 950, time delays 606 between corresponding erase pulses 652 and verify pulses 604 may substantially include the time needed to cycle through erasing a page of cells. Thus in these cases, time delay 606 may effectively be realized by operating on the other bits in the same page, as opposed to being the product of intentionally added delay.

The particular example of FIG. 9 may represent a page mode of operation, where one attempt pulse 602/652 is applied for each word until the end of a page. Subsequently, each word can be verified via corresponding verify pulses 604. Further, time delay 606 can be an inherent delay that results from other operations (e.g., other program or erase operations) on other words in a page. As such, no additional delay may be necessary because the particular program/erase effects of concern may have sufficiently dissipated by the time a corresponding verify pulse 604 after all such operations are completed on a given page.

Figure 10:
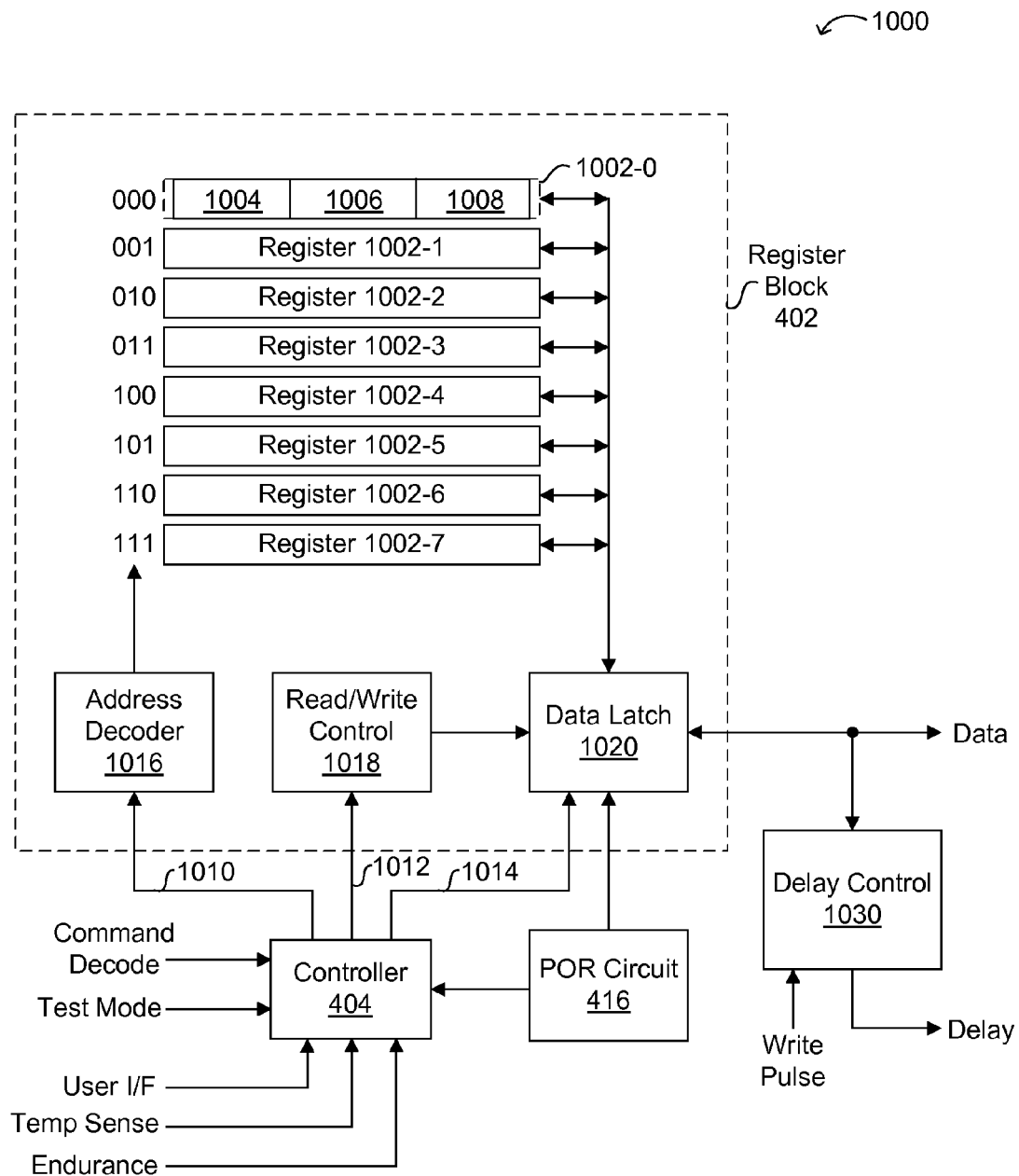
FIG. 10 is a schematic block diagram of an example register and delay control structure in accordance with embodiments of the present invention.

Referring now to FIG. 10, shown is a schematic block diagram 1000 of an example register and delay control structure in accordance with embodiments of the present invention. In this example, register block 402 can include eight registers 1002 (e.g., 1002-0, 1002-1, ... 1002-7). Each register 1002 can include a number of fields. For example, field 1004 may be a 2-bit wide field to store data representing temperature range delay adjustments (see, e.g., Table 1 above). Also for example, field 1006 may be a 2-bit wide field to store data representing endurance range delay adjustments (see, e.g., Table 2 above). Also for example, field 1008 may be a 2-bit wide field to store data representing retry loops. Other fields (not shown) may be used to indicate option variables to set conditions for the various algorithms. Various fields of registers 1002 may generally be used to form or support a conditions table that may be accessed (e.g., by program operation control 406, erase operation control 408, verify operation control 420, etc.) to set the conditions for one or more of the program and erase operations of a selected operation algorithm.

Register block 402 can also include address decoder 1016, which can receive signals 1010 (e.g., address, address load, etc.) from controller 404, and may provide 3-bit decoded values to address one of eight registers 1002. Read/write control 1018 can receive signals 1012 (e.g., read control signal, write control signal, etc.) from controller 404, and may provide a control signal to data latch 1020. Data latch 1020 can receive signals 1014 (e.g., read data strobe, data out enable, load data, etc.) from controller 404, and may receive or provide the data to/from register block 402. For example, data values can be provided to delay control 1030 (e.g., included within verify operation control 420) so that time delay 606 can be determined from the write pulses.

Also, while only eight registers are shown in the particular example of FIG. 10, any suitable number of registers can be accommodated in particular embodiments. For example, 24 registers can be included, where each register is 8-bits wide. In addition, such registers may support other programmable impedance device-based functions, such as word line voltage level, compliance current (e.g., where the cell is programmed until reaching this compliance current, X µA), equalization pulse width, single ended or differential sense amplifier configuration, as well as any number of other device functions and/or parameters. As discussed above, registers 1002 can be employed to facilitate determination of time delays 606. Such delay time between program/erase pulses and verify pulses may be programmable, and implemented as part of a digital, analog, or mixed signal block. As discussed above, time delays 606 may be in a range of from about 100 ns to about 10 ms, and may also be adaptive to a number of pulses which have been applied (e.g., more pulses, longer or shorter delay time).

Figure 11:
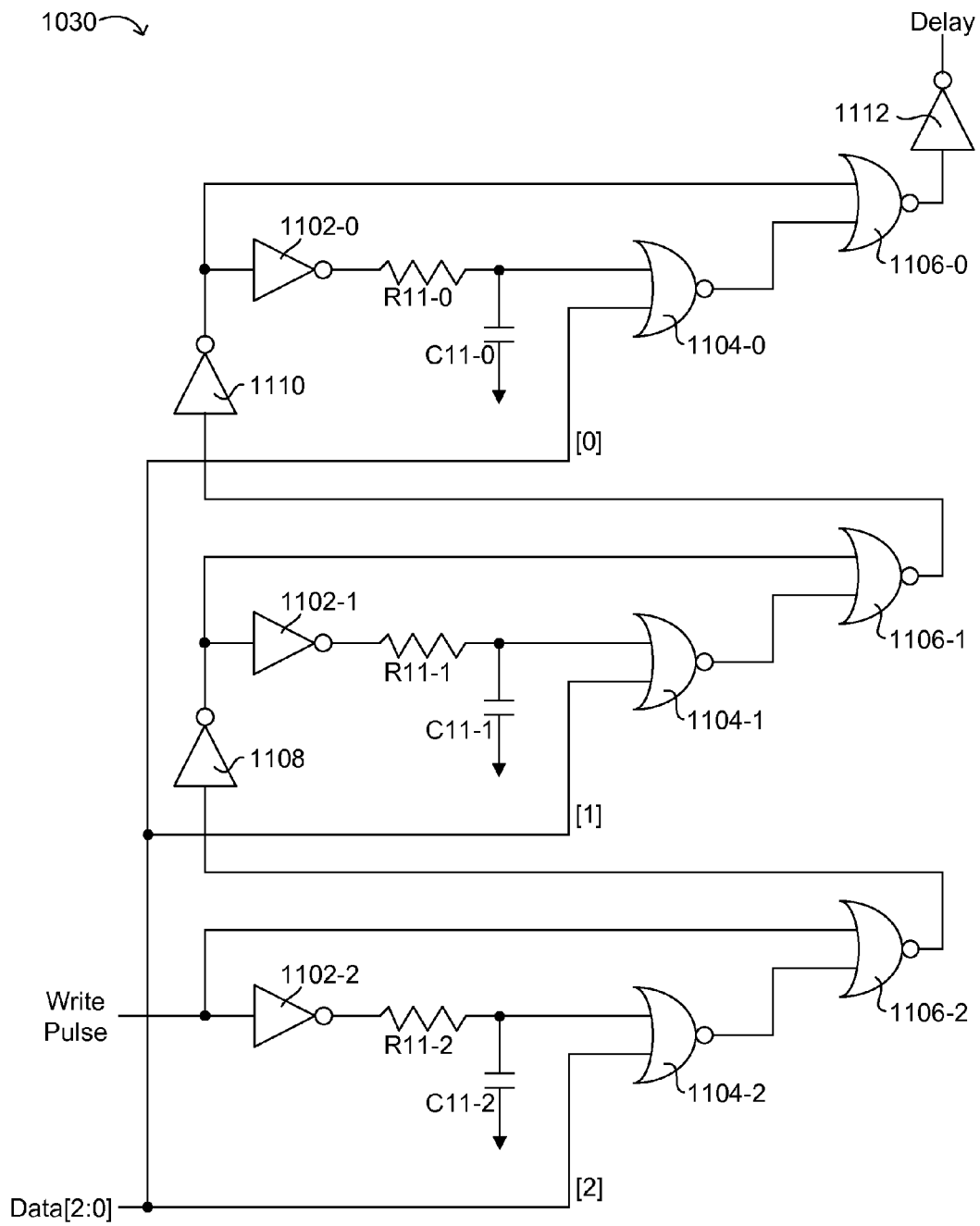
FIG. 11 is a schematic block diagram of an example delay control circuit for delay between program/erase and verify pulses, in accordance with embodiments of the present invention.

Referring now to FIG. 11, shown is a schematic block diagram of an example delay control circuit 1030 for delay between program/erase and verify pulses, in accordance with embodiments of the present invention. In this example, the delay signal as output from inverter 1112 can be delayed off a falling edge of the write pulse. Further, data values (e.g., data[2:0]) can be used to enable or disable particular delay stages. In this way, delay from a falling edge of the write pulse to the delayed signal output from inverter 1112 can be adjusted according to stored data values (e.g., from register block 402).

Each delay stage can include inverter 1102, resistor R11, capacitor C11, and NOR-gates 1104 and 1106. A first delay stage can be enabled by a low value on data[2], and can provide an output via inverter 1108 to a second delay stage. The second delay stage can be enabled by a low value on data[1], and can provide an output via inverter 1110 to a third delay stage, which can be enabled by low value on data[0]. When a given delay stage is enabled, upon a low transition of the input (e.g., write pulse to the first delay stage), capacitor C11 can be charged to a high level. Once capacitor C11 reaches a high level enough to trip NOR-gate 1104, a low signal can be provided to NOR-gate 1106. Thus, a delay from a low input transition may be added via delay elements of inverter 1102, resistor R11, capacitor C11, and NOR-gate 1104. A high input transition (e.g., write pulse to the first delay stage) can cause NOR-gate 1106 to output a low level and bypass the delay elements. Of course, the particular delay circuitry of FIG. 11 represents just one example of delay generation, and particular embodiments can accommodate any suitable delay circuitry implementation.

Figure 12:
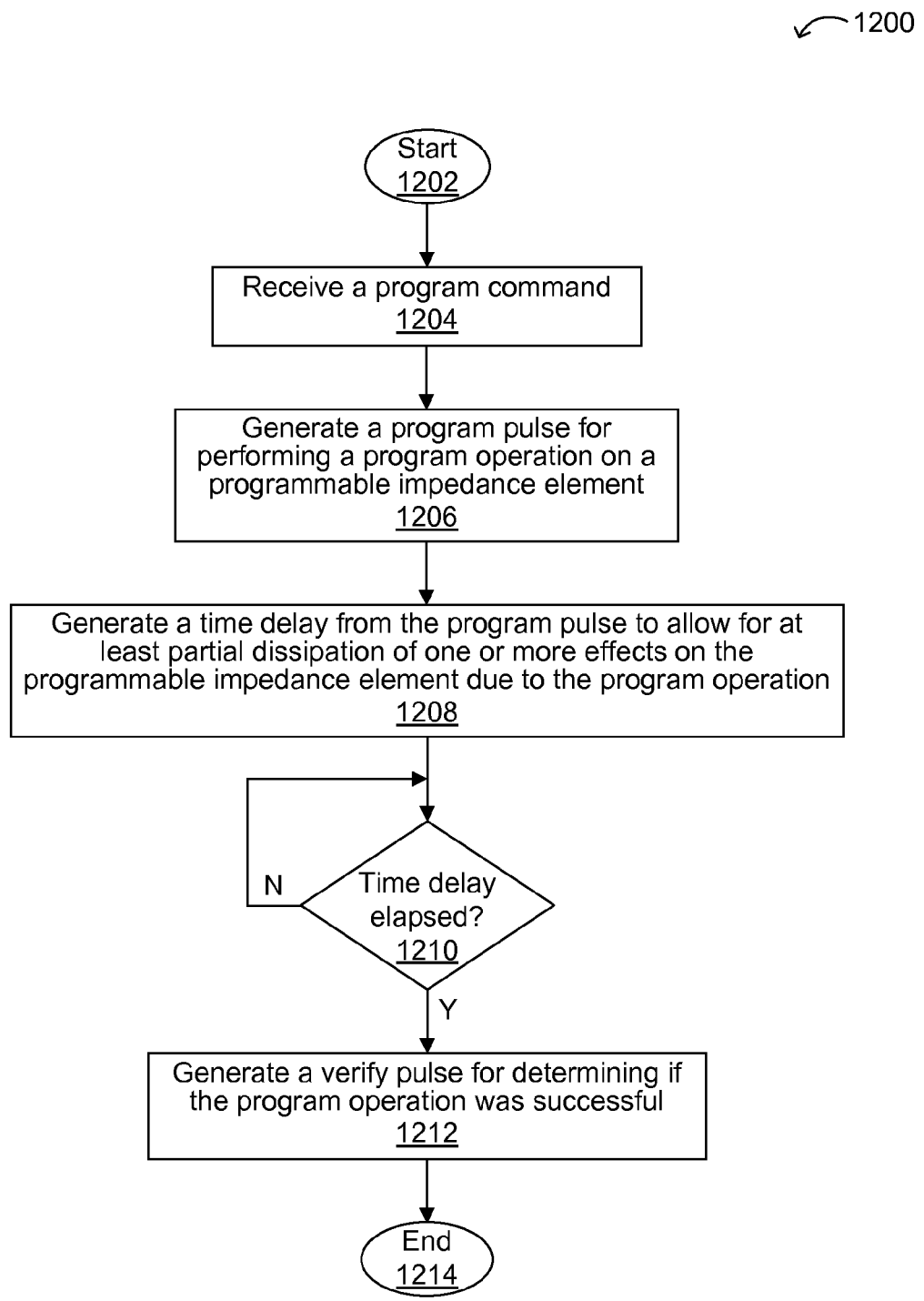
FIG. 12 is a flow diagram of an example program control operation in accordance with embodiments of the present invention.

Referring now to FIG. 12, shown is a flow diagram 1200 of an example program control operation in accordance with embodiments of the present invention. The flow can begin 1202, and at 1204 a program command can be received. For example, command decode 120 can decode the received command, and supply control signals, such as to controller 404 and program operation control 406, for execution of the program command. At 1206, a program pulse can be generated for performing a program operation on a programmable impedance element. For example, program operation control 406 can access option variables or a conditions table from register block 402 in order to generate the program pulse.

At 1208, a time delay from the program pulse can be generated. This time delay (e.g., 606) can allow for at least partial dissipation of one or more temporal effects (e.g., thermal, structure change, charge relaxation, diffusion, etc.) on the programmable impedance element due to the program operation. The time delay can be generated using delay control 1030, and may be based on a variety of feedback (e.g., device temperature, endurance cycling, page mode operation, failure mechanisms, initial device characterization, etc.). Once the time delay has elapsed at 1210, a verify pulse can be generated at 1212, completing the flow 1214. The verify pulse can be utilized to determine if the corresponding program operation was successful.

For a series of program operations, such as a page or row of memory cells being programmed, various repetitions and arrangements of the operations 1200 can be employed. For example, each verify pulse can follow a corresponding program pulse after a corresponding time delay, as in example 700. In another example, additional verify pulses can follow the scheme of example 700, as shown in example 800. In another example, a series of program pulses can be completed prior to a corresponding series of verify pulses, as shown in example 900. Particular embodiments can support any variety of such different operating modes, whereby sufficient time delay between program and verify pulses is provided in order to allow for dissipation of negative effects caused by the program pulse.

Figure 13:
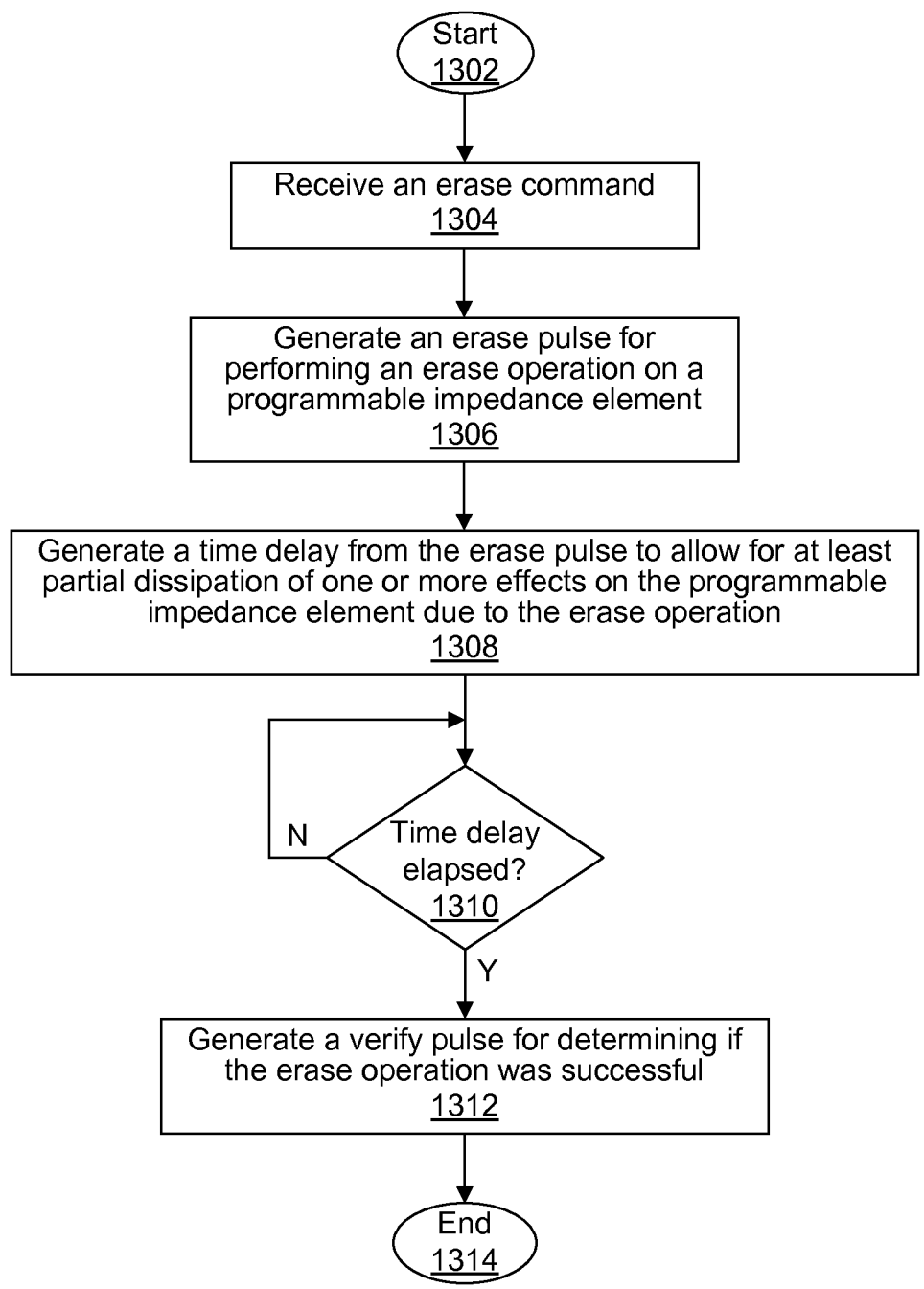
FIG. 13 is a flow diagram of an example erase control operation in accordance with embodiments of the present invention.

Referring now to FIG. 13, shown is a flow diagram 1300 of an example erase control operation in accordance with embodiments of the present invention. The flow can begin 1302, and at 1304 an erase command can be received. For example, command decode 120 can decode the received command, and supply control signals, such as to controller 404 and erase operation control 408, for execution of the erase command. At 1306, an erase pulse can be generated for performing an erase operation on a programmable impedance element. For example, erase operation control 408 can access option variables or a conditions table from register block 402 in order to generate the erase pulse.

At 1308, a time delay from the erase pulse can be generated. This time delay (e.g., 606) can allow for at least partial dissipation of one or more temporal effects (e.g., thermal, structure change, charge relaxation, diffusion, etc.) on the programmable impedance element due to the erase operation. The time delay can be generated using delay control 1030, and may be based on a variety of feedback (e.g., device temperature, endurance cycling, page mode operation, failure mechanisms, initial device characterization, etc.). Once the time delay has elapsed at 1310, a verify pulse can be generated at 1312, completing the flow 1314. The verify pulse can be utilized to determine if the corresponding erase operation was successful.

For a series of erase operations, such as a page or row of memory cells being programmed, various repetitions and arrangements of the operations 1300 can be employed. For example, each verify pulse can follow a corresponding erase pulse after a corresponding time delay, as in example 750. In another example, additional verify pulses can follow the scheme of example 750, as shown in example 850. In another example, a series of erase pulses can be completed prior to a corresponding series of verify pulses, as shown in example 950. Particular embodiments can support any variety of such different operating modes, whereby sufficient time delay between erase and verify pulses is provided in order to allow for dissipation of negative effects caused by the erase pulse.

In this fashion, particular embodiments can provide for an adjustable delay between program/erase pulses and corresponding verify pulses. Such a time delay can allow for various temporal effects from the corresponding program/erase pulse to at least partially dissipate, and to improve margins related to the intended program or erase operation.

It is also noted that, while only two storage states (state "0" and state "1") have been significantly described herein with respect to program and erase operations, PMCs may also each support more than one memory state. For example, depending on the voltage level controls, instead of a full erase or a full program, partial operations (e.g., by applying less/predetermined voltages for forward bias or reverse bias of the PMC) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance and bias voltage characteristics.

While the above examples include circuit, structural, and operational implementations of, and related to, certain memory cells and programmable impedance devices, one skilled in the art will recognize that other technologies and/or cell structures can be used in accordance with embodiments. Further, one skilled in the art will recognize that other device circuit arrangements, architectures, elements, operating modes, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of programming a programmable impedance element, the method comprising:
   a) receiving a program command to be executed on the programmable impedance element;
   b) generating, in response to the program command, at least one program pulse for performing a corresponding at least one program operation on the programmable impedance element;
   c) generating a time delay from each of the at least one program pulse, wherein the time delay comprises a duration sufficient to allow for at least partial dissipation of one or more effects caused by the corresponding program operation; and
   d) performing a first verify operation and, after the time delay has elapsed, performing a second verify operation to determine if the corresponding program operation has successfully programmed the programmable impedance element.

2. The method of claim 1, wherein:
   b) the time delay comprises an inherent delay plus a programmable delay.

3. The method of claim 1, wherein each of the first and second verify operations occurs after the corresponding program operation.

4. The method of claim 1, further comprising repeating performing the at least one program operation for a word of data.

5. The method of claim 1, wherein the second verify operation occurs after the at least one program operation.

6. The method of claim 1, wherein the at least one program operations comprises selecting an option variable for at least one of pulse widths, voltages, and currents.

7. The method of claim 1, wherein the generating the time delay comprises:
   a) determining a temperature; and
   b) setting the time delay based on the determined temperature.

8. The method of claim 1, wherein the generating the time delay comprises:
   a) determining an endurance life cycle; and
   b) setting the time delay based on the determined endurance life cycle.

9. The method of claim 1, wherein the generating time delay comprises accessing a data value from a register, wherein the data value corresponds to a time delay set by characterization of the programmable impedance element.

10. A method of erasing a programmable impedance element, the method comprising:
    a) receiving an erase command to be executed on the programmable impedance element;
    b) generating, in response to the erase command, at least one erase pulse for performing a corresponding at least one erase operation on the programmable impedance element;
    c) generating a time delay from each of the at least one erase pulse, wherein the time delay comprises a duration sufficient to allow for at least partial dissipation of one or more effects caused by the corresponding erase operation; and
    d) performing a first verify operation and, after the time delay has elapsed, performing a second verify operation to determine if the corresponding erase operation has successfully erased the programmable impedance element.

11. The method of claim 10, wherein:
    b) the time delay comprises an inherent delay plus a programmable delay.

12. The method of claim 10, wherein each of the first and second verify operations occurs after the corresponding erase operation.

13. The method of claim 10, further comprising repeating performing the at least one program operation for a word of data.

14. The method of claim 10, wherein the second verify operation occurs after the at least one erase operation.

15. The method of claim 10, wherein the at least one erase operations comprises selecting an option variable for at least one of pulse widths, voltages, and currents.

16. The method of claim 10, wherein the generating the time delay comprises:
   a) determining a temperature; and
   b) setting the time delay based on the determined temperature.

17. The method of claim 10, wherein the generating the time delay comprises:
   a) determining an endurance life cycle; and
   b) setting the time delay based on the determined endurance life cycle.

18. The method of claim 10, wherein the generating time delay comprises accessing a data value from a register, wherein the data value corresponds to a time delay set by characterization of the programmable impedance element.

19. An apparatus, comprising:
   a) a command decoder configured to receive a program/erase command to be executed on a programmable impedance element;
   b) a program/erase operation controller configured to generate, in response to the program/erase command, at least one write pulse for performing a corresponding at least one program/erase operation on the programmable impedance element;
   c) a delay controller configured to generate a time delay from each of the at least one write pulse, wherein the time delay comprises a duration sufficient to allow for at least partial dissipation of one or more effects on the programmable impedance element caused by the corresponding program/erase operation; and
   d) a verify operation controller configured to perform first and second verify operations to determine if the program/erase operation has successfully written the programmable impedance element, wherein at least one of the first and second verify operations begins after the time delay has elapsed.

20. The apparatus of claim 19, further comprising a register coupled to the verify operation controller and the delay controller, wherein the delay controller is configured to enable or disable predetermined delay elements based on data values from the register.

* * * * *